United States Patent [19]
Zhu et al.

[11] Patent Number: 6,090,304
[45] Date of Patent: Jul. 18, 2000

[54] METHODS FOR SELECTIVE PLASMA ETCH

[75] Inventors: Helen H. Zhu, Milpitas; George A. Mueller, San Jose; Thomas D. Nguyen, Campbell; Lumin Li, Santa Clara, all of Calif.

[73] Assignee: LAM Research Corporation, Fremont, Calif.

[21] Appl. No.: 08/919,659

[22] Filed: Aug. 28, 1997

[51] Int. Cl.[7] .................................................. C03C 15/00
[52] U.S. Cl. ............................................ 216/79; 438/724
[58] Field of Search ..................................... 438/710, 714, 438/718, 719, 723, 724, 725, 729; 216/67, 72, 74, 79, 80, 71

[56] References Cited

U.S. PATENT DOCUMENTS

| | | | |
|---|---|---|---|
| 4,267,012 | 5/1981 | Pierce et al. | 156/643 |
| 4,412,885 | 11/1983 | Wang et al. | 156/643 |
| 4,740,485 | 4/1988 | Sharpe-Geisler | 437/246 |

(List continued on next page.)

FOREIGN PATENT DOCUMENTS

| | | | |
|---|---|---|---|
| 489 407 A2 | 6/1992 | European Pat. Off. | H01J 37/32 |
| 622 477 A1 | 11/1994 | European Pat. Off. | C23F 4/00 |
| 0637067 | 2/1995 | European Pat. Off. | |
| 0 763 850 A1 | 3/1997 | European Pat. Off. | |
| 3842758A1 | 6/1990 | Germany | H01J 21/90 |

(List continued on next page.)

OTHER PUBLICATIONS

T. Ahn, S. Nam, K. Min and C. Chung, "Effect of Residual Gases on Residue Formation during Tungsten/TiN/Ti Etching Using $SF_6$ and $Cl_2$ Gas Chemistry", Jpn. J. Appl. Phys. vol. 33 (1994) pp. :918–L920, Part 2, No. 7A, Jul. 1, 1994.

P. Riley, S. Peng and L. Fang, "Plasma Etching of Aluminum for ULSI Circuits", Solid State Technology, vol. 36, No. 2, Feb. 1993, Washington.

R. Gottscho and C. Jurgensen, and D. Vitkavage, "Microscopic Uniformity in Plasma Etching", Journal of Vacuum Science and Technology B, Microelectronic Process and Phenomena, vol. 10, No. 5, Oct. 1992, pp. 2133–2147.

P. Riley, R. Holbert, R. Kavari, and L. Lujan, "Composite metal etching for submicron integrated circuits", Extended Abstracts, vol. 93, No. 1, May 1993, The Electrochemical Society, inc., Princeton, NJ.

Youn j. et al., "Effects of Process Parameters on Microloading in Sub–halfmicron Aluminum Etching," Proceeding of the SPIE–INT. Soc. for Optical Engineering, USA, XP–002062782, vol. 2875, pp. 312–321.

Gabriel C.T. et al., "Minimizing metal etch rate pattern sensitivity in a high plasma etcher," Journal of vaccum Science & Technology, May/Jun. 1997, XP–002062781, pp. 697–701.

Abraham S.C. et al., "Performance of different etch chemistries on titanium anti reflective coating layers and related selectivity and microloading improvements for sub–micron geometries obtained with a high–density metal ether," Journal of Vacuum Science & Technology, May/Jun. 1997, XP–002062780, pp. 702–706.

*Primary Examiner*—Thi Dang
*Assistant Examiner*—Luz Alejandro
*Attorney, Agent, or Firm*—Hickman Stephens Coleman & Hughes, LLP

[57] ABSTRACT

Disclosed is a method for improving the selectivity of dielectric layers to photoresist layers and base layers. The method is performed in a plasma processing chamber, and the photoresist layer is coated over the dielectric layer. The method includes introducing an etchant source gas into the plasma processing chamber, which consists essentially of a $C_xF_y$ gas and an $N_2$ gas. The method further includes striking a plasma in the plasma processing chamber from the etchant source gas. The method additionally includes etching at least a portion of the dielectric layer with the plasma through to a base layer that underlies the dielectric layer. The method is also well suited for anisotropically etching an oxide layer with very high selectivities to Si, $Si_3N_4$, TiN, and metal silicides.

6 Claims, 6 Drawing Sheets

U.S. PATENT DOCUMENTS

| | | | |
|---|---|---|---|
| 4,878,994 | 11/1989 | Jucha et al. | 156/643 |
| 4,980,018 | 12/1990 | Mu et al. | 156/643 |
| 5,256,245 | 10/1993 | Keller et al. | 156/643 |
| 5,269,879 | 12/1993 | Rhoades et al. | 156/643 |
| 5,296,094 | 3/1994 | Shan et al. | 156/651 |
| 5,320,707 | 6/1994 | Kanekiyo et al. | 156/665 |
| 5,326,427 | 7/1994 | Jerbic | 156/643 |
| 5,356,478 | 10/1994 | Chen et al. | 134/1 |
| 5,411,631 | 5/1995 | Hori et al. | 216/72 |
| 5,429,070 | 7/1995 | Campbell et al. | 118/723 |
| 5,468,339 | 11/1995 | Gupta et al. | 216/67 |
| 5,496,762 | 3/1996 | Sandhu et al. | 437/60 |
| 5,505,816 | 4/1996 | Barnes et al. | 156/662.1 |
| 5,514,247 | 5/1996 | Shan et al. | 156/643.1 |
| 5,522,520 | 6/1996 | Kawamoto | 216/62 |
| 5,540,812 | 6/1996 | Kadomura | 156/652.1 |
| 5,545,289 | 8/1996 | Chen et al. | 156/643.1 |
| 5,562,801 | 10/1996 | Nulty | 156/643.1 |
| 5,620,615 | 4/1997 | Keller | 438/720 |
| 5,668,038 | 9/1997 | Huang et al. | 438/396 |
| 5,719,089 | 2/1998 | Cheng et al. | 438/637 |
| 5,770,098 | 6/1998 | Araki et al. | 216/67 |
| 5,843,847 | 12/1998 | Pu et al. | 438/723 |
| 5,910,453 | 6/1999 | Gupta et al. | 438/717 |

FOREIGN PATENT DOCUMENTS

| | | |
|---|---|---|
| 54-125979 | 9/1979 | Japan . |
| 56-111222 | 9/1981 | Japan . |
| 58-060611 | 4/1983 | Japan . |
| 63-230889 | 9/1988 | Japan . |
| 1-214025 | 8/1989 | Japan . |
| 07074156 | 3/1995 | Japan . |
| 10-125654 | 5/1998 | Japan . |
| WO 9730472 | 8/1997 | WIPO . |

METHODS FOR SELECTIVE PLASMA ETCH

BACKGROUND OF THE INVENTION

1. Field of the Invention

The present invention relates to the fabrication of semiconductor integrated circuits (IC's). More particularly, the present invention relates to improved methods and apparatus for the fabrication of high aspect ratio features of semiconductor devices with high selectivities.

2. Description of the Related Art

In semiconductor IC fabrication, devices such as component transistors are formed on a semiconductor wafer substrate, which is typically made of silicon. During the fabrication process, various materials are deposited on different layers in order to build a desired IC. Typically, conductive layers, which may include patterned metallization lines, polysilicon transistor gates and the like, are insulated from one another by dielectric materials (e.g., $SiO_2$, BPSG, PSG, TEOS, etc.). Because semiconductor ICs are fabricated as multi-layered structures, there is a common need to interconnect IC features that are patterned on one layer with IC features of another layer. To accomplish these interconnections, via holes are typically etched through the dielectric materials down to an underlying IC feature.

Once the via holes are etched, the via holes are filled with a conductive material (e.g., tungsten, aluminum, etc.) to establish conductive "vias" between the underlayer and a subsequently deposited and patterned metallization layer. In other cases, via holes are etched down to an underlying polysilicon transistor gate or silicon wafer diffusion regions. Once these vias are etched, the via holes are conductively filled to form electrical "contacts" between the underlying devices and a subsequently deposited and patterned metallization layer.

For ease of discussion, FIG. 1A shows a cross-sectional view of a semiconductor wafer 10 having various deposited and etched layers. As shown, a transistor device including a gate oxide 20, polysilicon gate 22, spacers 24 and diffusion regions 12 is formed over a surface of the semiconductor wafer 10. In general, once the components of the transistor device are formed, a dielectric layer 16 is deposited to a suitable thickness over the device and the semiconductor wafer 10. As mentioned above, via holes are typically required to be etched down to the polysilicon gate 22 and diffusion regions 12, such that appropriate electrical interconnections may be made. In conventional via hole etching techniques, a photoresist layer 18 is applied and then patterned to expose region where via holes will ultimately reside.

Once the photoresist layer 18 is patterned, a combination of fluorocarbons (e.g., $CF_4/CHF_3$) gases are used to etch through the dielectric layer 16. Unfortunately, these combinations of fluorocarbon chemistries suffer because they have poor etch-stop characteristics when etching small features with high aspect ratios. To overcome these etch stop issues, $O_2$ and/or CO chemistries are usually added to the plasma gases. However, when $O_2$ is added, a substantial amount of the photoresist layer 18 is removed as well as a portion of an underlayer.

Further, when an excessive amount of photoresist layer 18 is removed, a decrease in the thickness from about $PR_1$ to about $PR_2$ may occur during via hole etching operations. With a substantial amount of the photoresist layer 18 lost, it is often difficult to achieve good critical dimension (CD) control. In some cases, when the dielectric layer is substantially thick, the photoresist layer 18 may become completely consumed even before the via hole 14b is completely formed.

Although, the commonly used CxFy/CO plasma etch chemistry consumes less photoresist than the $CxFy/O_2$ plasma chemistry, it has been found to exhaust an excessive amount of toxic by-products during etching operations. Of course, reducing environmental hazards is always a desired aspect of semiconductor manufacturing. As such, when environmentally adverse fabrication chemicals are used, cleaning and disposal costs are also increased.

The conventional plasma etch chemistries therefore exhibit very poor selectivity because a substantial amount of the photoresist layer 18 as well as layers (e.g., polysilicon, silicon, metallization, etc.) that underlie the via hole are excessively etched when the via holes are etched through the dielectric layer 16. As mentioned above and shown in FIG. 1A, an excessive amount of polysilicon material may be removed from the polysilicon gate 22 when via hole 14a is etched, while just enough etching was completed in via hole 14b.

To combat this problem, thicker photoresists 18 are being applied, to ensure that a suitable amount of photoresist material remains over protected regions of the dielectric layer 16. A problem with adding increasingly thicker photoresist layers 18 is that the aspect ratios of the via holes increase. For example, if the width of the via holes stay constant, and the height increases, the aspect ratio (i.e., aspect ratio=height/width) will necessarily increase. Unfortunately, when poor selectivity is coupled with increasing aspect ratios, it is often difficult to achieve good critical dimension (CD) control in semiconductor devices having smaller and smaller dimensions.

Furthermore, a thicker photoresist layer 18 is not practical for small feature applications due to photolithography tool limitations. This is because for smaller features, the wavelengths of the exposed light used in photolithography tools need to be shorter to achieve a better resolution. However, shorter wavelengths suffer in that they have a shallower focus depth. This is further complicated because contact and via holes continue to shrink in size, and the thickness of the photoresist layers are becoming thinner than ever before.

In view of the foregoing, what is needed are improved methods and apparatus for achieving high selectivities without slowing down etching operations through dielectric materials.

SUMMARY OF THE INVENTION

The present invention fills these needs by providing an improved etch chemistry for selectively etching through selected regions of a photoresist masked dielectric layer. The improved selectivity advantageously enables the plasma etching of via holes and contact holes having large aspect ratios while removing substantially less photoresist, and base layer materials. It should be appreciated that the present invention can be implemented in numerous ways, including as a process, an apparatus, a system, a device, and a method. Several inventive embodiments of the present invention are described below.

In one embodiment, a method for etching through a selected portion of a dielectric layer of a wafer in a plasma processing chamber is disclosed. The method includes introducing an etchant source gas into the plasma processing chamber, which consists essentially of a CxFy gas and an $N_2$ gas. The method further includes striking a plasma in the plasma processing chamber from the etchant source gas. The method additionally includes etching at least partially through the dielectric layer with the plasma.

In another embodiment, a method for improving the selectivity of a dielectric layer to a photoresist layer and the base layer materials is disclosed. The method is performed in a plasma processing chamber, and the photoresist layer is coated over the dielectric layer. The method includes introducing an etchant source gas into the plasma processing chamber, which consists essentially of a CxFy gas and an $N_2$ gas. The method further includes striking a plasma in the plasma processing chamber from the etchant source gas. The method additionally includes etching at least a portion of the dielectric layer with the plasma through to a base layer that underlies the dielectric layer.

In yet another embodiment, a method for improving the selectivity of a dielectric layer to a photoresist layer is disclosed. The method is performed in a plasma processing chamber, and the photoresist layer is coated over the dielectric layer. The method includes introducing an etchant source gas into the plasma processing chamber. The etchant gas is selected from a group consisting of a $C_2F_6$ gas, a $C_4F_8$ gas, or a $C_3F_6$ gas, and an $N_2$ gas and an Ar gas. The method further includes striking a plasma in the plasma processing chamber from the etchant source gas. The method additionally includes etching a high aspect ratio via hole through the dielectric layer with the plasma down to a base layer that underlies the dielectric layer.

Advantageously, the substantially improved photoresist selectivity of this invention enables the application of substantially thinner photoresist masks as well as the ability to anisotropically etch via holes having high aspect ratios while maintaining good critical dimension (CD) control. In still another embodiment, the high selectivity of the inventive chemistries advantageously enable precision etching through dielectric layers of varying depths without excessively removing the materials lying under the dielectric layer. These and other advantages of the present invention will become apparent upon reading the following detailed descriptions and studying the various figures of the drawings.

BRIEF DESCRIPTION OF THE DRAWINGS

The invention, together with further advantages thereof, may best be understood by reference to the following description taken in conjunction with the accompanying drawings.

DETAILED DESCRIPTION OF THE PREFERRED EMBODIMENTS

An invention is described for an improved etch chemistry for selectively etching through selected regions of a photoresist masked dielectric layer. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

Figure 1A:
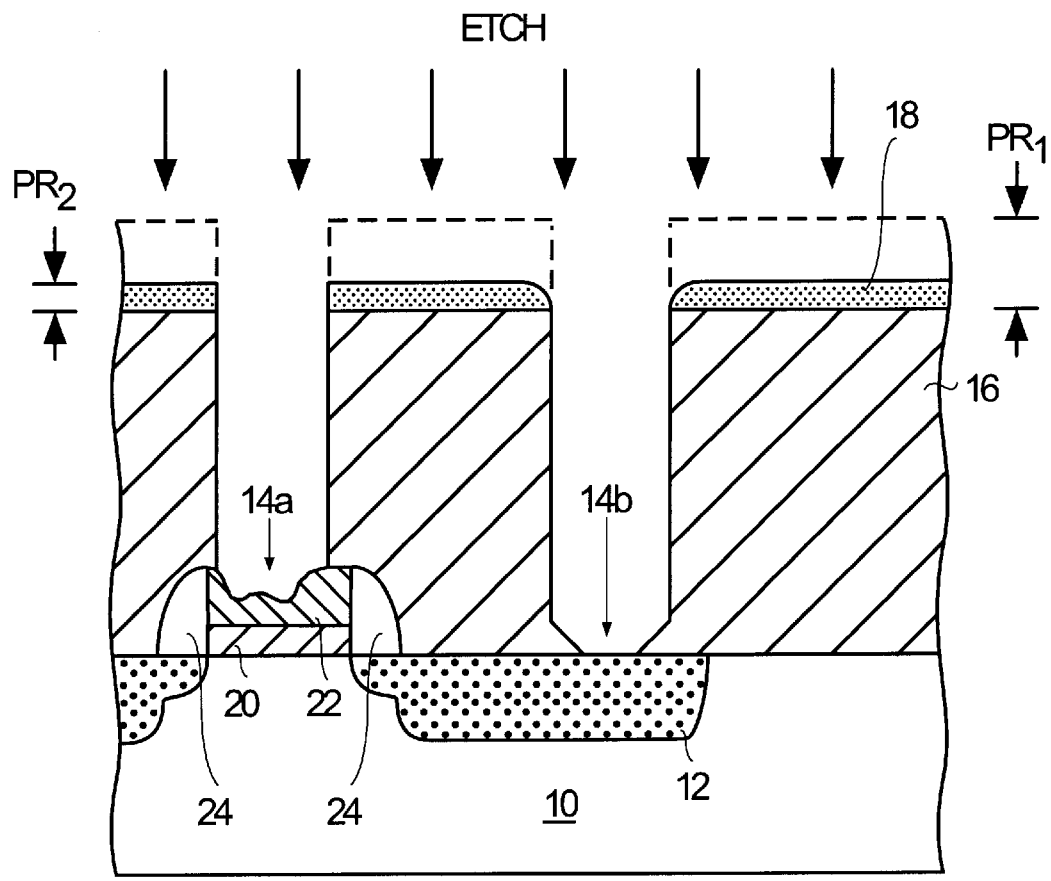
FIG. 1A shows a cross-sectional view of a semiconductor wafer having various conventionally deposited and etched layers.
Figure 1B:
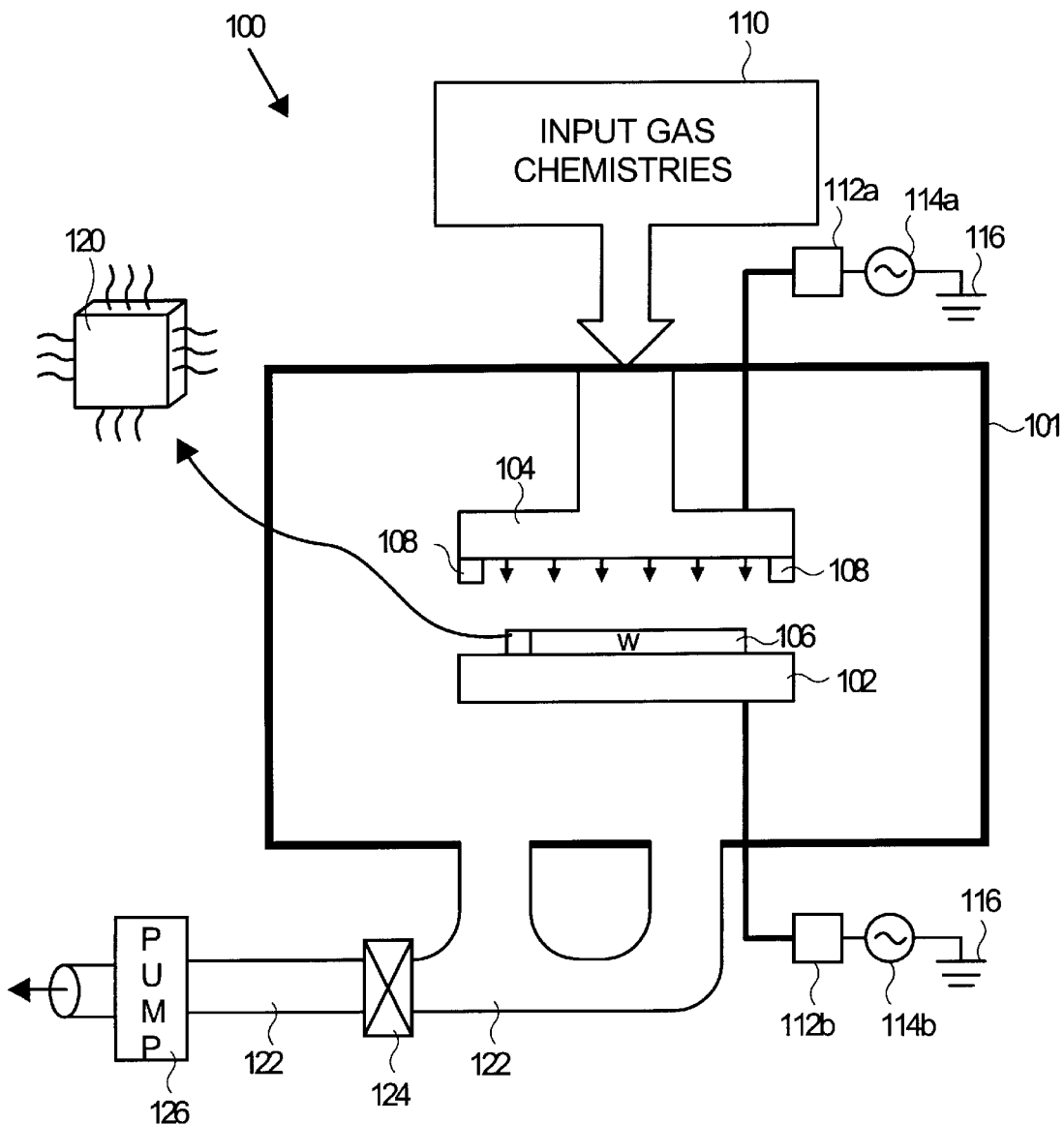
FIG. 1B shows a plasma etching system including a process chamber in accordance with one embodiment of the present invention.

FIG. 1B shows a plasma etching system 100 including a process chamber 101 in accordance with one embodiment of the present invention. The process chamber 101 generally includes a bottom electrode 102 and a top electrode 104, which also acts as a shower head for allowing input gas chemistries 110 to enter the process chamber 101 at a location that is between the bottom electrode 102 and the top electrode 104. Generally, the top electrode 104 includes a quartz confinement ring 108 that circles an edge that is under the top electrode 104. In this manner, the quartz confinement ring 108 is directly above a wafer 106 that is placed on top of the bottom electrode 102 (i.e., chuck).

The process chamber 101 therefore establishes a dual frequency parallel plate processing arrangement where a first radio frequency (RF) source 114a is coupled to the top electrode 104 through an RF matching network 112a. In a like manner, the bottom electrode 102 is coupled to a second RF source 114b through a second RF matching network 112b. Further, each of the RF sources 114a and 114b are coupled at one end to ground 116.

In operation, the process chamber 101 may exhaust processing gasses through a high conductance pumping network 122 that leads to a VAT valve 124. The VAT Valve 124 is then coupled to a drag pump 126 that assists in channeling the process gas to a suitable storage unit (not shown). In one embodiment, the wafer 106 is subjected to a multitude of processing operations, including the high selectivity etching performed in the process chamber 101, that enables the fabrication of a plurality of semiconductor dies. The semiconductor dies are in turn packaged to produce a plurality of packaged integrated circuit chips 120. In one embodiment, the process chamber 101 may be a Lam Research Rainbow 4520XL processing chamber, which is available from Lam Research Corporation of Fremont, Calif. Of course, other suitably arranged processing chambers may be used to achieve the highly selective etching operations of the present invention.

By way of example, the invention may be practiced in a number of other suitably arranged processing chambers that deliver energy to the plasma through capacitively coupled parallel electrode plates, through electron cyclotron resonance (ECR) microwave plasma sources, through inductively coupled RF sources such as helicon, helical resonators, and transformer coupled plasma (TCP). ECR and TCP plasma processing systems, among others, are also available from Lam Research Corporation of Fremont, Calif. Other examples of suitable processing chambers include an inductive plasma source (IPS), a decoupled plasma source (DPS), and a dipole ring magnet (DRM). IPS and DPS plasma processing systems are available from Applied Materials of Santa Clara, Calif. DRM source plasma processing equipment are available from Tokyo Electron Limited of Japan.

Figure 2:
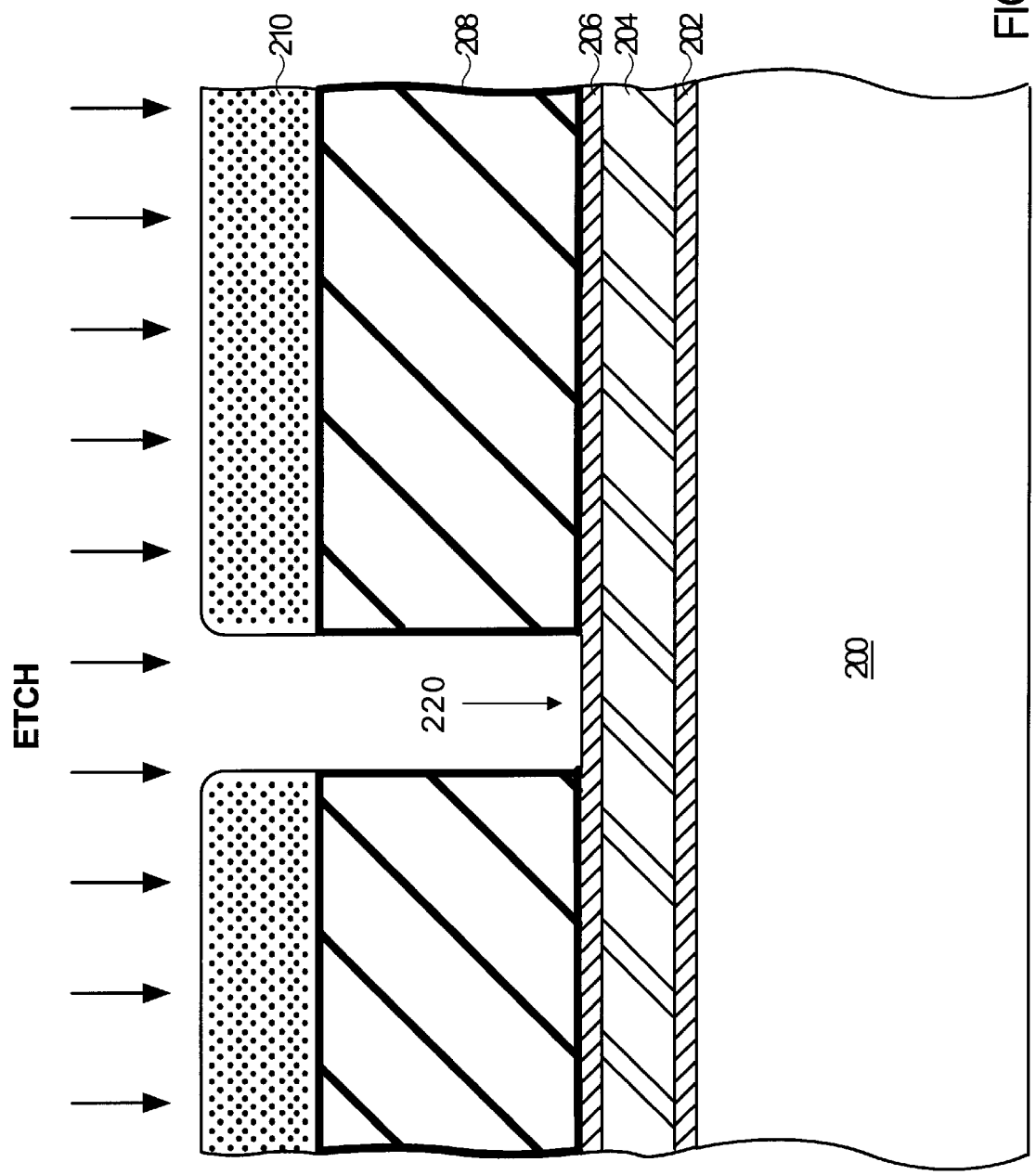
FIG. 2 is a cross-sectional view of a semiconductor wafer exhibiting an exemplary selective via etch through a dielectric layer in accordance with one embodiment of the present invention.

FIG. 2 is a cross-sectional view of a semiconductor wafer 200 exhibiting a number of fabricated layers in accordance with one embodiment of the present invention. As shown, a silicon dioxide ($SiO_2$) layer 202 is first thermally grown over the surface of the semiconductor wafer 200. Although the thickness of a silicon dioxide layer 202 varies, a preferred thickness may be about 1,000 angstroms. Next, a polysilicon layer 204 having an exemplary thickness of about 3,000 angstroms is deposited over the silicon dioxide layer 202. Once the polysilicon layer 204 is deposited to a suitable thickness, a titanium-silicide ($TiSi_2$) layer 204 is formed to a thickness of about 1,000 angstroms.

A dielectric layer 208 is then deposited over the titanium-silicide layer 206 to a thickness of between about 5,000 angstroms and about 20,000 angstroms or greater. In one embodiment, the dielectric layer 208 material may be any number of well known doped or un-doped dielectrics that are commonly used as insulators between patterned conductive levels in semiconductor devices. By way of example, the dielectric layer 208 may be a silicon dioxide ($SiO_2$) layer, a borophosphosilicate glass (BPSG) layer, a tetra-ethyl-ortho-silicate (TEOS), phosphosilicate glass (PSG) layer, etc. Once the dielectric layer 208 has been deposited to a suitable thickness, a photoresist layer 210 is spin coated to a thickness of between about 5,000 angstroms and about 10,000 angstroms.

Next, the photoresist layer 210 is selectively exposed in a photolithography process that implements a reticle-stepper apparatus for patterning the photoresist layer 210. After exposure and development, a patterned photoresist layer 210 will remain, such that etching will occur down through regions that are not covered by the photoresist layer 210. In this example, the photoresist layer 210 was patterned such that a via hole may be etched through the dielectric layer 208 when a selective plasma etching operation in accordance with the present invention is performed.

The etching operations are preferably performed in the plasma etching system 100 of FIG. 1B, while utilizing the inventive chemistries described in Tables 1A through 1C. In this embodiment, the inventive chemistry is preferably a $C_xF_y/N_2/Ar$ mixture, where "x" ranges between about 1 and 4, and "y" ranges between about 1 and 8. In addition, argon (Ar) is preferably used as a dilutant for the inventive chemistry gasses, such that the flow rate of Ar is between about 0 and 400 sccms, and more preferably, between about 100 and 300 sccms, and most preferably about 200 sccms for each of the examples of Tables A through C. The parameters provided below are preferably associated with the fabrication of an 8 inch wafer, although, other sizes and shapes, such as those employed in the manufacture of semiconductor devices and flat panel displays, may benefit from the improved selectivity achieved by the inventive etch chemistries.

TABLE A

Exemplary Etch Chemistry $C_2F_6/N_2/Ar$

| Ranges | Top Power (watts) | Bottom Power (watts) | Flow Rates | | Pressure | Temp |
|---|---|---|---|---|---|---|
| Preferred Range | 500–1500 | 1000–2500 | 2–20 sccms $C_2F_6$ | 10–100 sccms $N_2$ | 15–100 mTorrs | −20° C. to 50° C. |
| More Preferred Range | 700–1200 | 1500–2200 | 4–10 sccms $C_2F_6$ | 20–70 sccms $N_2$ | 20–60 mTorrs | 15° C. to 40° C. |

TABLE A-continued

Exemplary Etch Chemistry $C_2F_6/N_2/Ar$

| Ranges | Top Power (watts) | Bottom Power (watts) | Flow Rates | | Pressure | Temp |
|---|---|---|---|---|---|---|
| Most Preferred Range | 900 | 2000 | 6 sccms $C_2F_6$ | 30 sccms $N_2$ | 30 mTorr | 30° C. |

As shown in Table A, one preferred chemistry is $C_2F_6/N_2/Ar$, where the most preferred etch recipe includes adjusting the top power at about 900 watts, the bottom power at about 2,000 watts, the flow rate of $C_2F_6$ at about 6 sccms, the flow rate of $N_2$ at about 30 sccm, the pressure at about 30 mTorr, and the temperature at about 30 degrees Celsius.

TABLE B

Exemplary Etch Chemistry $C_4F_8/N_2/Ar$

| Ranges | Top Power (watts) | Bottom Power (watts) | Flow Rates | | Pressure | Temp |
|---|---|---|---|---|---|---|
| Preferred Range | 500–1500 | 1000–2500 | 2–15 sccms $C_4F_8$ | 10–150 sccms $N_2$ | 15–100 mTorrs | −20° C. to 50° C. |
| More Preferred Range | 700–1200 | 1500–2200 | 3–8 sccms $C_4F_8$ | 20–70 sccms $N_2$ | 20–60 mTorrs | 15° C. to 40° C. |
| Most Preferred Range | 900 | 2000 | 6 sccms $C_4F_8$ | 60 sccms $N_2$ | 25 mTorr | 30° C. |

As shown in Table B, another preferred chemistry is $C_4F_8/N_2/Ar$, where the most preferred etch recipe includes adjusting the top power at about 900 watts, the bottom power at about 2,000 watts, the flow rate of $C_4F_8$ at about 6 sccms, the flow rate of $N_2$ at about 60 sccm, the pressure at about 25 mTorr, and the temperature at about 30 degrees Celsius.

TABLE C

Exemplary Etch Chemistry $C_3F_6/N_2/Ar$

| Ranges | Top Power (watts) | Bottom Power (watts) | Flow Rates | | Pressure | Temp |
|---|---|---|---|---|---|---|
| Preferred Range | 500–1500 | 1000–2500 | 2–15 sccms $C_3F_6$ | 10–100 sccms $N_2$ | 15–100 mTorrs | −20° C. to 50° C. |
| More Preferred Range | 700–1200 | 1500–2200 | 3–8 sccms $C_3F_6$ | 20–70 sccms $N_2$ | 20–60 mTorrs | 15° C. to 40° C. |
| Most Preferred Range | 900 | 2000 | 5 sccms $C_3F_6$ | 40 sccms $N_2$ | 30 mTorr | 30° C. |

As shown in Table C, yet another preferred chemistry is $C_3F_6/N_2/Ar$, where the most preferred etch recipe includes adjusting the top power at about 900 watts, the bottom power at about 2,000 watts, the flow rate of $C_3F_6$ at about 5 sccms, the flow rate of $N_2$ at about 40 sccm, the pressure at about 30 mTorr, and the temperature at about 30 degrees Celsius.

By implementing the above-described preferred chemistries as input gas chemistries 110 in FIG. 1B, a substantially improved etching operation that exhibits a high selectivity between the photoresist layer 210 and the dielectric layer 208 results. In other words, an advantageous etch ratio of between about 7:1 and about 10:1 is achieved for the "dielectric layer" to the "photoresist layer." As such, the dielectric layer may etch up to 10 times faster than the photoresist layer 210.

In view of this substantial improvement in selectivity, devices having high aspect ratios (e.g., "R" 24 4), which are common in the etching of via holes and contacts holes, may be etched with superior critical dimension (CD) control. In the example of FIG. 2, the inventive chemistries described above also provide an improved selectivity with respect to base layers that underlie the dielectric layer 208. Therefore, when via holes 220 are etched down through the dielectric layer 208, substantially less of the underlying titanium silicide layer 206 is removed. Although a titanium silicide layer 206 has been used as the exemplary layer that underlies the dielectric layer 208, the inventive chemistries are also highly selective to other materials that commonly underlie dielectric layers 208. By way of example, such materials may include titanium nitride (TiN), tungsten silicide ($WSi_2$), silicon nitride (SiN), polysilicon, silicon, and metallizations including aluminum/copper mixtures.

Figure 3:
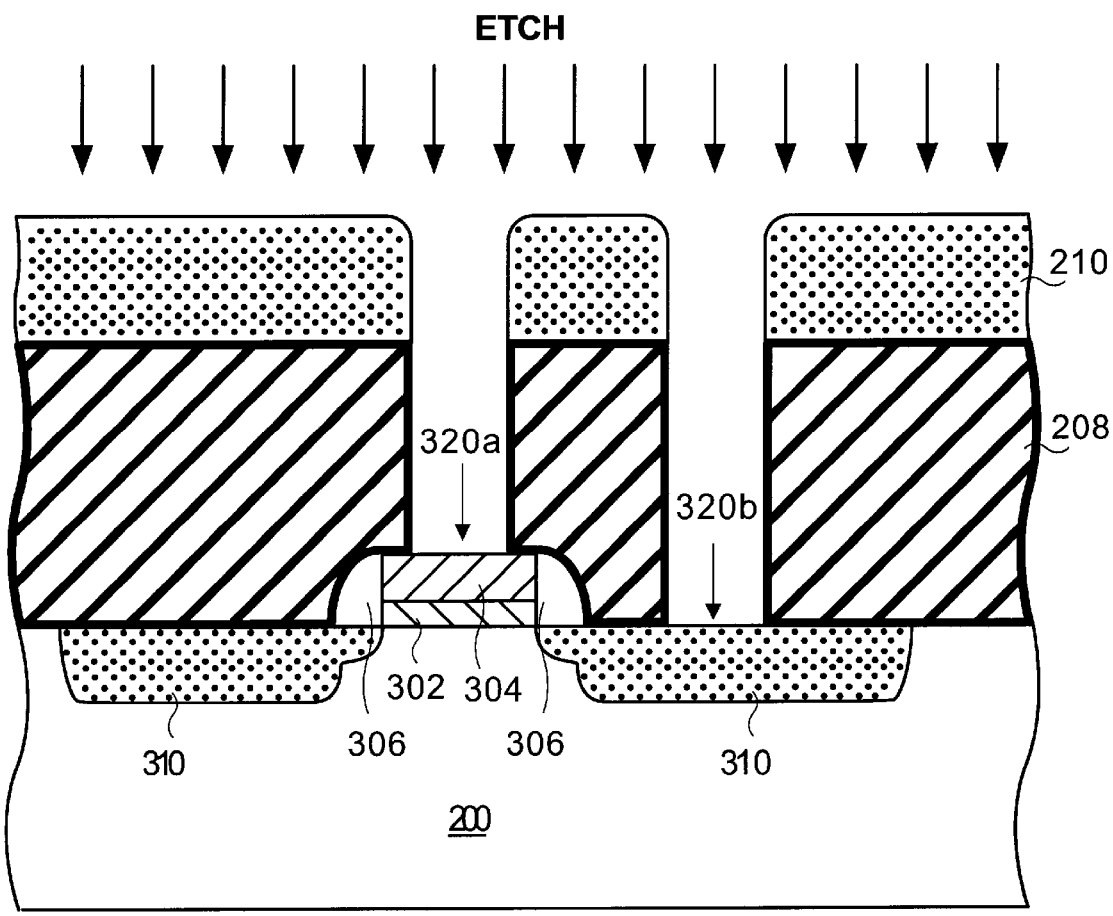
FIG. 3 is a cross-sectional view of a semiconductor wafer having selectively etched contact holes through a dielectric layer in accordance with one embodiment of the present invention.

FIG. 3 is a cross-sectional view of a semiconductor wafer 200 having a semiconductor device fabricated thereon in accordance with one embodiment of the present invention. In this example, an etch operation is also preferably performed in the plasma etching system 100 of FIG. 1B, utilizing the inventive chemistries described above in Tables A through C. The semiconductor device is shown having a gate oxide 302, a polysilicon gate 304, spacers 306, and diffusion regions 310. Deposited over the semiconductor device is a dielectric layer 208, that may be deposited to a thickness of between about 5,000 angstroms and about 20,000 angstroms.

Once the dielectric layer 208 is deposited to a suitable thickness, a photoresist layer 210 is spin-coated and patterned over the surface of the dielectric layer 208. As mentioned above, the photoresist layer 210 is preferably applied to a thickness of between about 5,000 angstroms and about 10,000 angstroms. After the photoresist layer 210 is patterned to expose regions where contact holes down to the polysilicon gate 304 and diffusion region 310 are to be defined, the semiconductor wafer 200 is placed into the plasma etching system 100 over the bottom electrode 102. Next, the inventive etch chemistries are applied into the chamber, and the pressure and temperature are allowed to stabilize before powering-up the plasma etching system 100. As in the above examples, the etching operation is a highly selective operation, that is selective to the photoresist layer 210, the underlying polysilicon gate 304, and diffusion regions 310.

In this manner, contact holes 320a leading down to the polysilicon gate 304 and the diffusion region 310 will be formed without excessively etching the polysilicon gate 304, nor excessively etching the photoresist layer 210. Table D below illustrates the improved etch selectivity achieved between the dielectric layer 208 and a number of exemplary materials that typically underlie the dielectric layer 208.

TABLE D

| Material | Range of Selectivity for Dielectric to Material | Approximate Selectivity for Dielectric to Material |
| --- | --- | --- |
| Titanium-silicide | 20:1 to 100:1 | 40:1 |
| Tungsten-silicide | 20:1 to 100:1 | 40:1 |
| Polysilicon | 20:1 to 100:1 | 50:1 |

TABLE D-continued

| Material | Range of Selectivity for Dielectric to Material | Approximate Selectivity for Dielectric to Material |
| --- | --- | --- |
| Silicon (doped/undoped) | 20:1 to 100:1 | 50:1 |
| Titanium-Nitride | 20:1 to 100:1 | 40:1 |
| Silicon-Nitride | 10:1 to 40:1 | 20:1 |
| Aluminum/Copper | 20:1 to 100:1 | 50:1 |

Because such improved selectivities of dielectric layers to photoresist layers is achieved, it is now possible to etch deep contact/via holes in devices while advantageously retaining enough photoresist for CD control. Therefore, the inventive chemistries provide a solution for high aspect ratio applications. In addition, because the inventive chemistries are non-toxic as compared to conventional carbon monoxide based chemistries (e.g., $C_xF_y$/CO chemistries), the etching operations are more environmentally conscious.

Figure 4:
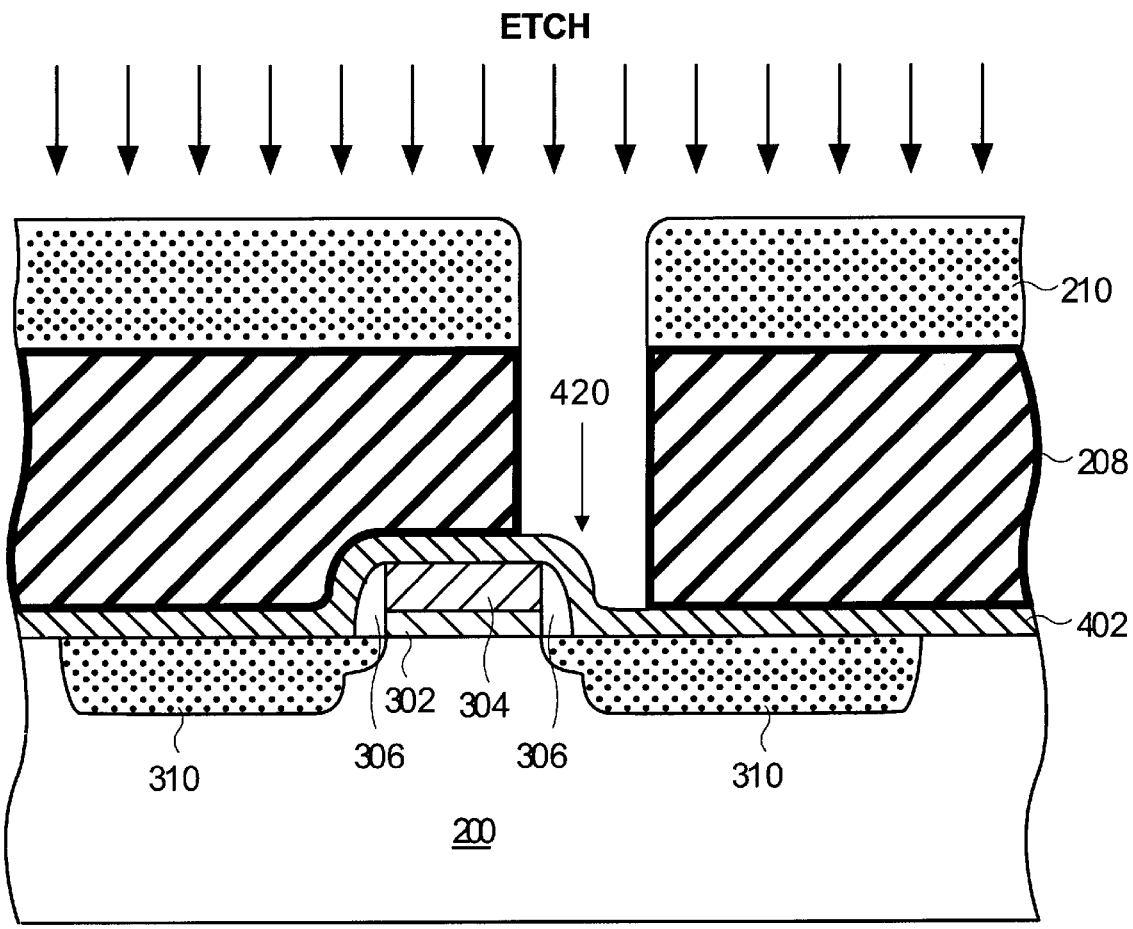
FIG. 4 is yet another cross-sectional view of a semiconductor wafer having a selectively etched self-aligned via hole through a dielectric layer in accordance with one embodiment of the present invention.

FIG. 4 is yet another cross-sectional view of a semiconductor wafer 200 having a semiconductor device fabricated thereon in accordance with one embodiment of the present invention. In this example, a self-aligned contact (SAC) hole 420 is etched down to a silicon nitride ($Si_3N_4$) layer 402. In this example, the silicon nitride layer 402 is preferably formed using well known CVD processes. Once the silicon nitride layer 402 has been formed over the semiconductor device, the dielectric layer 208 is deposited to a suitable thickness ranging between about 5,000 angstroms and about 20,000 angstroms. As in prior examples, a photoresist layer 210 that ranges between about 5,000 angstroms and about 10,000 angstroms is applied over the dielectric layer 208. The photoresist layer 208 is then patterned to expose regions where a via hole 420 will ultimately be etched.

After the photoresist layer 210 has been patterned, the semiconductor wafer 200 is placed into the plasma etching system 100 and subjected to the selective etch chemistries. As such, the SAC hole 420 is defined through the dielectric layer 208 down to the silicon nitride layer 402, without excessively removing the titanium silicide as well as preventing excessive removal of the photoresist layer 210.

Figure 5:
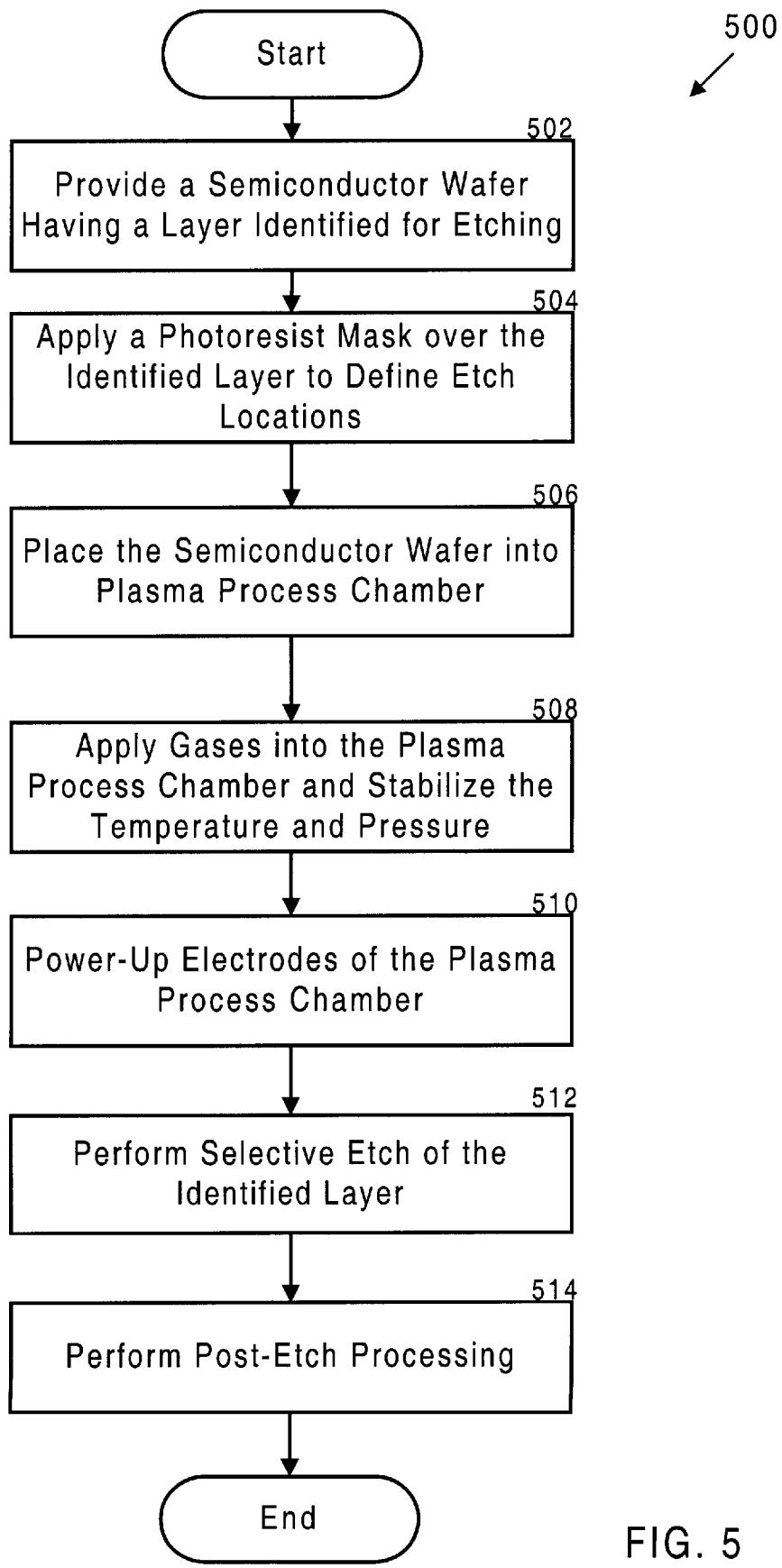
FIG. 5 is a flowchart diagram describing the preferred method operations for performing a highly selective plasma etch operation in accordance with one embodiment of the present invention.

FIG. 5 is a flowchart diagram 500 describing the preferred method operations for performing a highly selective etching operation in accordance with one embodiment of the present invention. The method begins at an operation 502 where a semiconductor wafer having a layer identified for etching is provided. Preferably, the layer identified for etching is a dielectric layer that is deposited to a suitable thickness ranging between about 5,000 angstroms and about 20,000 angstroms.

Next, the method proceeds to an operation 504 where a photoresist mask is applied over the identified layer to define etching locations. As mentioned above, the photoresist mask is preferably patterned to define locations where either via holes, contacts, self-aligned contact or trenches will be formed after the etching operation. Once the photoresist mask is applied in operation 504, the method proceeds to an operation 506 where the semiconductor wafer is placed into the plasma process chamber. Next, the inventive gas chemistries are applied into the plasma processing chamber and allowed to stabilize to a suitable temperature and pressure. In one embodiment, the pressure is stabilized when it is between about 15 mTorr and about 100 mTorr, and the temperature is between about 10 and about 50 degrees Celsius.

Once the plasma process chamber has stabilized, the method will proceed to an operation 510 where the electrodes of the plasma process chamber are powered-up to the preferred power levels described in Tables A through C above. By way of example, the top power associated with electrode 104 is preferably powered-up between about 500 watts, and about 1,500 watts. The bottom power that is associated with the bottom electrode 102 is preferably powered-up between about 1,000 watts and about 2,500 watts.

Once powered-up, the method proceeds to an operation 512 where the selective etching illustrated in FIGS. 2 through 4 are performed through the layer identified in operation 502. Once etching is complete, the method proceeds to an operation 514 where post-etch processing that is conventional in nature is performed. Thereafter, the finished wafer may be cut into dies, which may then be made into IC chips. The resulting IC chip, e.g., IC chip 220 of FIG. 1B, may then be incorporated in an electronic device, e.g., any of the of well known commercial or consumer electronic devices, including digital computers. Once packaged, the method will be complete.

While this invention has been described in terms of several preferred embodiments, there are alterations, permutations, and equivalents which fall within the scope of this invention. It should also be noted that there are may alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In a plasma processing chamber, a method for etching through a selected portion of a dielectric layer of a wafer, comprising:

introducing an etchant source gas into the plasma processing chamber, the etchant source gas consisting essentially of a $C_3F_6$ gas and an $N_2$ gas;

striking a plasma in the plasma processing chamber from the etchant source gas;

etching at least partially through the dielectric layer with said plasma which is positioned over a base layer that underlies the dielectric layer the base layer including a silicon-nitride ($Si_3N_4$) layer;

flowing the $C_3F_6$ gas at a flow rate of between about 2 and about 15 standard cubic centimeters per minute (sccm);

producing an etch ratio selectivity of at least about (20:1) for the dielectric layer to the silicon-nitride layer;

flowing the $N_2$ gas at a flow rate of between about 10 and about 100 standard cubic centimeters per minute (sccm);

flowing an argon (Ar) gas having a flow rate of between about 0 and 400 standard cubic centimeters per minute (sccm) into the plasma processing chamber;

producing an etch ratio selectivity of at least about (7:1) for the dielectric layer to the photoresist layer, wherein the photoresist layer is coated over the dielectric layer;

wherein the dielectric layer is one of a doped and undoped dielectric material including a silicon dioxide ($SiO_2$) layer;

wherein a chamber pressure within said plasma processing chamber is between about 15 mTorr and about 100 mTorr during the etching;

wherein a chamber temperature within the plasma processing chamber is about 30 degrees Celsius; and wherein a top electrode of the plasma processing chamber has a power level adjusted to 900 Watts and a bottom electrode of the plasma processing chamber has a power level adjusted to 2000 Watts.

2. In a plasma processing chamber, a method for improving a selectivity of a dielectric layer to a photoresist layer and to a base layer, wherein the photoresist layer is coated over the dielectric layer, comprising: introducing an etchant source gas into the plasma processing chamber, the etchant gas consists essentially of a $C_3F_6$ gas and a $N_2$ gas; striking a plasma in the plasma processing chamber from the etchant source gas; etching at least a portion of the dielectric layer with the plasma through to the base layer that underlies the dielectric layer, wherein the base layer includes a silicon-nitride ($Si_3N_4$) layer; flowing the $C_3F_6$ gas at a flow rate of between about 2 and about 15 standard cubic centimeters per minute (sccm); and producing an etch ratio selectivity of at least (20:1) for the dielectric layer to the silicon-nitride layer; and wherein a top electrode of the plasma processing chamber has a power level adjusted to between 500 and 1500 Watts and a bottom electrode of the plasma processing chamber has a power level adjusted to between 1000 and 2500 Watts.

3. The method for improving a selectivity of a dielectric layer to a photoresist layer and to a base layer as recited in claim , further comprising:

flowing the $N_2$ gas at a flow rate of between about 10 and about 150 standard cubic centimeters per minute (sccm).

4. The method for improving a selectivity of a dielectric layer to a photoresist layer and to a base layer as recited in claim 3, further comprising:

flowing an argon (Ar) gas having a flow rate of between about 0 and 400 standard cubic centimeters per minute (sccm) into the plasma processing chamber.

5. The method for improving a selectivity of a dielectric layer to a photoresist layer and to a base layer as recited in claim 4, further comprising:

producing an etch ratio selectivity of at least about (7:1) for the dielectric layer to the photoresist layer.

6. The method for improving a selectivity of a dielectric layer to a photoresist layer and to a base layer as recited in claim 3, wherein holes selected from the group consisting of via holes and contact holes are defined through the dielectric layer without excessively removing the photoresist layer or the base layer.

* * * * *